United States Patent [19]
Airaksinen et al.

[11] Patent Number: 6,040,711
[45] Date of Patent: *Mar. 21, 2000

[54] CMOS OUTPUT BUFFER HAVING A SWITCHABLE BULK LINE

[75] Inventors: Maria Leena Airaksinen, Tremestieri Etneo; Giorgio Catanzaro, Messina, both of Italy

[73] Assignee: SGS-Thomson Microelectronics S.r.l., Agrate Brianza, Italy

[*] Notice: This patent is subject to a terminal disclaimer.

[21] Appl. No.: 08/670,000

[22] Filed: Jun. 26, 1996

Related U.S. Application Data

[63] Continuation-in-part of application No. 08/623,317, Mar. 26, 1996, Pat. No. 5,852,382.

[30] Foreign Application Priority Data

Mar. 31, 1995 [EP] European Pat. Off. .............. 95830120

[51] Int. Cl.⁷ ............................................. H03K 19/0185
[52] U.S. Cl. ................................................. 326/81; 326/83
[58] Field of Search .................... 326/21, 80–81, 326/121, 83, 86

[56] References Cited

U.S. PATENT DOCUMENTS

| | | | |
|---|---|---|---|
| 5,144,165 | 9/1992 | Dhong et al. | 326/80 |
| 5,160,855 | 11/1992 | Dobberpuhl | 326/21 X |
| 5,300,832 | 4/1994 | Rogers | 307/475 |
| 5,381,061 | 1/1995 | Davis | 326/57 |
| 5,448,198 | 9/1995 | Toyoshima et al. | 326/81 X |
| 5,534,795 | 7/1996 | Wart et al. | 327/534 |
| 5,539,335 | 7/1996 | Kobayashi et al. | 326/81 |
| 5,546,020 | 8/1996 | Lee et al. | 327/534 |
| 5,552,723 | 9/1996 | Shigehara et al. | 327/534 |
| 5,646,550 | 7/1997 | Campbell, Jr. et al. | 326/81 |
| 5,852,382 | 12/1998 | Lentini et al. | 327/534 |

FOREIGN PATENT DOCUMENTS

| | | | |
|---|---|---|---|
| 0 556 605 | 8/1993 | European Pat. Off. | H03K 19/01 |
| 0 621 692 | 10/1994 | European Pat. Off. | H03K 19/00 |

*Primary Examiner*—Jon Santamauro
*Attorney, Agent, or Firm*—Wolf, Greenfield & Sacks, P.C.; James H. Morris; Theodore E. Galanthay

[57] ABSTRACT

A CMOS output buffer circuit includes a final amplifier stage having a pull-up transistor and a pull-down transistor connected between a voltage supply and ground and having a common output node, and a control circuitry for driving the final amplifier stage including a first logic gate supplied with an input data signal, the first logic gate driving the pull-up transistor, a second logic gate supplied with said input data signal, the second logic gate driving the pull-down transistor. The pull-up transistor has a bulk electrode connected to a switchable bulk line; an auxiliary circuit is provided which as long as a voltage of the output node is not higher than said supply voltage keeps said switchable bulk line connected to the voltage supply. The first logic gate includes circuitry for transferring the voltage of the output node to said switchable bulk line when the voltage of the output node exceeds the supply voltage.

16 Claims, 2 Drawing Sheets

CMOS OUTPUT BUFFER HAVING A SWITCHABLE BULK LINE

CROSS REFERENCE TO RELATED APPLICATIONS

This application is a continuation-in-part of application Ser. No. 08/623,317, filed Mar. 26, 1996, now U.S. Pat. No. 5,852,382 entitled THREE-STATE CMOS OUTPUT BUFFER CIRCUIT, the disclosure of which is hereby incorporated by reference.

BACKGROUND OF THE INVENTION

1. Field of the Invention

The present invention relates to a CMOS output buffer circuit.

2. Discussion of the Related Art

As known to anyone skilled in the art, conventional CMOS output buffer circuits include a CMOS final driving stage, which in turn includes a P-channel MOSFET (pull-up) and an N-channel MOSFET (pull-down) connected in series between a voltage supply line (VDD) and a common ground (GND).

The circuits can further include a control circuitry for the activation of the CMOS final driving stage; such a control circuitry mixes the input data signal with an enable/disable signal for the activation of a so-called three-state (or high impedance) mode, in which both the MOSFETs of the final stage are off. In its most simple form, the control circuitry includes a NAND gate, at whose inputs the input data signal and the enable/disable signal are applied and whose output drives the gate of the P-channel pull-up, and a NOR gate, at whose inputs the input data signal and the enable/disable signal (complemented) are applied and whose output drives the gate of the N-channel pull-down.

An important requirement which integrated circuits need to satisfy is power-down compatibility. This means that when the power supply of the printed circuit board whereon the integrated circuits are mounted is turned off, the integrated circuits are not to be damaged and must not give rise to significant leakage currents. These characteristics are extremely important in portable electronic systems (computer, mobile phones etc.) Wherein reduced power consumption is a key feature.

An integrated device with the terminal tied to the voltage supply line VDD grounded can have a non-zero voltage applied to its input and/or output terminals. In the case of a CMOS output buffer circuit, the parasitic diode associated with the pull-up MOSFET of the final driving stage could turn on, thus damaging the device.

It is also known that there is a trend towards reducing the value of the supply voltage. A few years ago the standard for CMOS was 5 V, nowadays a lot of 3 V applications are found. It is also common to have electronic systems in which 3 V-supplied boards are interfaced with 5 V-supplied boards. In the High-speed CMOS (HCMOS) logic family interface circuits are available which allow 3 V-supplied boards to be connected to a same bus as 5 V-supplied boards.

A 3 Volts integrated circuit which, in the three-state mode, is capable of sustaining a 5 Volts at its outputs, is said to be "5 Volts tolerant".

An integrated circuit with three-state output buffer circuits of the type described above and supplied at 3 V is not 5 Volts tolerant, i.e. it cannot be connected to a bus of signals driven at an higher voltage, for example 5 V, for the following reason: the P-channel pull-up is formed inside an N type well constituting the so-called "bulk". The N-type well or bulk is connected to the voltage supply VDD, to prevent, in any operating condition, the junctions between the P-type source and drain regions of the P-channel pull-up and the bulk from being forward biased. If however the voltage supply VDD is 3 V and the voltage of the output of the final stage, i.e. the drain of the P-channel pull-up, can increase to a value of 5 V, the junction between the P-type drain of the P-channel pull-up and the bulk is forward biased, which causes a high leakage current to flow; such a current, being so high, can damage the integrated circuit.

This problem has been recognized for a long time, and solutions to it have been proposed. Some of these solutions are however not suitable for logic integrated circuits, because they involve the use of components working in the linear region, thus dissipating power.

In "Tips For Straddling The 3-V To 5-V Fence", Electronic Design, Apr. 4, 1994, 5-V tolerant three-state output buffer circuits are proposed that make use of Schottky diodes to block the leakage current. In one of the proposed solutions, the bulk of the P-channel pull-up is not connected to the voltage supply VDD directly, but through a Schottky diode; the bulk is further connected, through another Schottky diode, to the output node of the final driving stage.

The drawback of the these solutions is that they involve the use of BiCMOS (Bipolar CMOS) technologies, more expensive than the known CMOS or HCMOS technologies.

In the U.S. Pat. No. 5,270,589 (Toshiba) two output buffer circuit solutions are disclosed: in the first solution, an N-channel pass transistor is connected between the output node of the final stage (the drain of the P-channel pull-up) and the output pad; the gate N-channel pass transistor is driven by a voltage VDD' higher than VDD. This requires a second, external power supply line (which is impossible for devices having fixed pin number and configuration), or an on-chip charge pump to boost VDD to VDD'. The second solution is similar to the first solution, but the pass transistor is an N-channel depletion MOSFET with gate connected to VDD. The problem is that in some technologies depletion MOSFETs are not available.

In the U.S. Pat. No. 5,151,619 (IBM) an output buffer circuit is disclosed which makes use of a transmission gate with floating bulk to decouple the final stage from the remaining of the circuit.

In view of the state of the art described, it is an object of the present invention to provide a CMOS output buffer circuit with power-down compatibility.

It is another object of the invention to provide a CMOS output buffer circuit with three-state capability, suitable for applications wherein integrated circuits with different voltage supplies must be interfaced, which is structurally different from and overcomes the drawbacks of the known circuits.

SUMMARY OF THE INVENTION

According to the present invention, these and other objects are attained by means of a three-state CMOS output buffer circuit comprising: —a final amplifier stage comprising a pull-up transistor and a pull-down transistor connected between a voltage supply and ground and having a common output node; —a control circuitry for driving the final amplifier stage comprising:
  a first logic gate supplied with an input data signal, the first logic gate driving the pull-up transistor;
  a second logic gate supplied with said input data signal, the second logic gate driving the pull-down transistor, wherein said pull-up transistor has a bulk electrode connected to a switchable bulk line, and in that an auxiliary circuit is provided which as long as a voltage of the output node is not higher than said supply voltage keeps said switchable bulk line connected to the voltage supply, said first logic gate comprising means for transferring the voltage of the output node to said switchable bulk line when the voltage of the output node exceeds the supply voltage.

An output buffer circuit according to the present invention is compatible to power-down, i.e. it is possible to switch the voltage supply off without the risk of incurring high leakage currents irrespective of the potential applied to the output node. In fact, the pull-up of the final stage has the bulk electrode connected to a line whose voltage is always the highest between the supply voltage of the integrated circuit comprising the output buffer and the voltage of the external bus signal line. For the same reason the output buffer circuit is 5 Volts tolerant, i.e. it makes it possible to interface an integrated circuit supplied with, e.g., 3 Volts to a same bus to which an integrated circuit supplied with 5 Volts is connected. No leakage currents arise when the output buffer is in a three-state mode and a 5 Volt signal is applied to the bus.

BRIEF DESCRIPTION OF THE DRAWINGS

The features and advantages of the present invention will be made more evident by the following detailed description of the invention, illustrated as a non-limiting example in the annexed drawings wherein.

DETAILED DESCRIPTION

Figure 1:
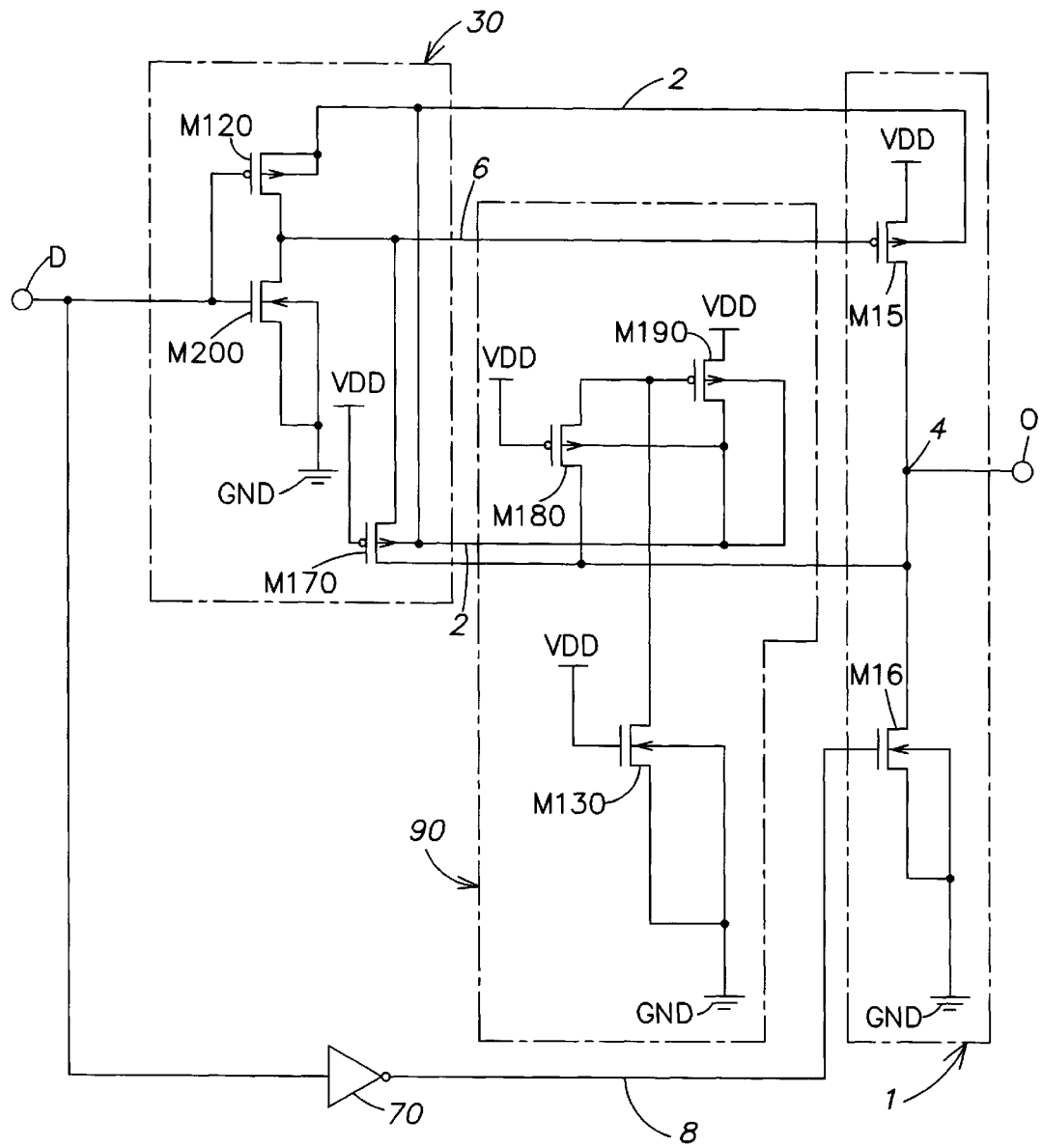
FIG. 1 is a circuit diagram of a first embodiment of CMOS output buffer circuit according to the present invention.

With reference to FIG. 1, there is shown a three-state CMOS output buffer circuit according to a first embodiment of the present invention. The circuit comprises, in a per-se known way, a final stage 1 comprising a pull-up P-channel MOSFET M15 and a pull-down N-channel MOSFET M16 connected in series between a voltage supply VDD (for example 3 V or 5 V) and a common ground GND. More precisely, the pull-up M15 has its source connected to VDD and its drain connected to the drain of the pull-down M16, this last having its source connected to GND. The common node 4 of M15 and M16 forms an output data signal O of the buffer circuit. It is to be noted that, differently from conventional final stages, the bulk electrode of the P-channel pull-up M15 is not short-circuited to VDD, but is instead connected to a circuit node 2, which as will be described later on forms a switchable bulk line.

The buffer circuit further comprises control circuitry for driving the final stage 1. The control circuitry comprises a first inverter stage 30 supplied by an input data signal D. The inverter stage 30 includes a P-channel MOSFET M120 and an N-channel MOSFET M200 connected in series; differently from conventional CMOS inverters, the source electrode of MOSFET M120 is not connected to VDD, but to circuit node 2. Furthermore, the inverter stage 30 comprises a P-channel MOSFET M170 with gate connected to VDD, drain connected to the output 6 of the inverter stage 30 and source connected to the output node 4 of the final stage 1; the bulk electrode of M170 is connected to circuit node 2. The output node 6 of the inverter stage 30 drives the pull-up MOSFET M15 of the final stage 1.

The control circuitry comprises a conventional inverter 70 supplied by the input data signal D and having an output signal 8 driving the pull-down MOSFET M16 of the final stage 1.

According to the invention, the control circuitry includes an auxiliary circuit 90. Auxiliary circuit 90 comprises a P-channel MOSFET M190 with source connected to VDD, drain and bulk connected to circuit node 2 and gate connected to the drain of an N-channel MOSFET M130; this last has the gate connected to VDD and the source connected to ground; the bulk electrode of M130 is also connected to ground. A further P-channel MOSFET M180 with gate connected to VDD has the drain connected to the gate of M190, the source connected to the output node 4 of the final stage 1 and the bulk connected to circuit node 2. N-channel MOSFET M130 forms a bias network for M190.

The buffer circuit of FIG. 1 operates in the following way.

In normal conditions, when the voltage supply VDD is equal to 3 V or 5 V, the switchable bulk line 2 is kept at VDD by M190, which is kept on by M130. In this condition, if D="0" output signal 6 of the inverter stage 30 is a logic "1" and the pull-up MOSFET M15 of the final stage 1 is turned off; similarly, output signal 8 of inverter 70 is a logic "1" and the pull-down MOSFET M16 of the final stage 1 is turned on; the output signal 0 of the buffer circuit is a logic "0". On the contrary, if D="1", signal 6 and signal 8 are both logic "0", M16 is turned off, M15 is turned on and the output signal 0 is a logic "1".

In power-down condition, when VDD is approximately 0 V, M130 is turned off, while M170 and M180 turn of if the output signal 0 of the final stage takes a potential corresponding to the high logic level; if this happens, M190 is turned off by M180, and the switchable bulk line 2, by means of M170 and M120, takes a potential substantially corresponding to the high logic level (more precisely, the potential of node 2 is equal to VDD minus the threshold voltage of a P-channel MOSFET). In this way, the drain-bulk junction of MOSFET M15 is prevented from being forward biased, and no leakage current flows.

It is important to note that even if in normal operating conditions signals 6 and 8 have always the same logic levels, they cannot be short circuit to each other, eliminating the inverter 70; in fact, it has been verified that a single inverter with floating bulk cannot drive, in addition to the pull-up MOSFET M15, the pull-down MOSFET M16 of the final stage 1; turning off a M16 would be excessively slow.

Figure 2:
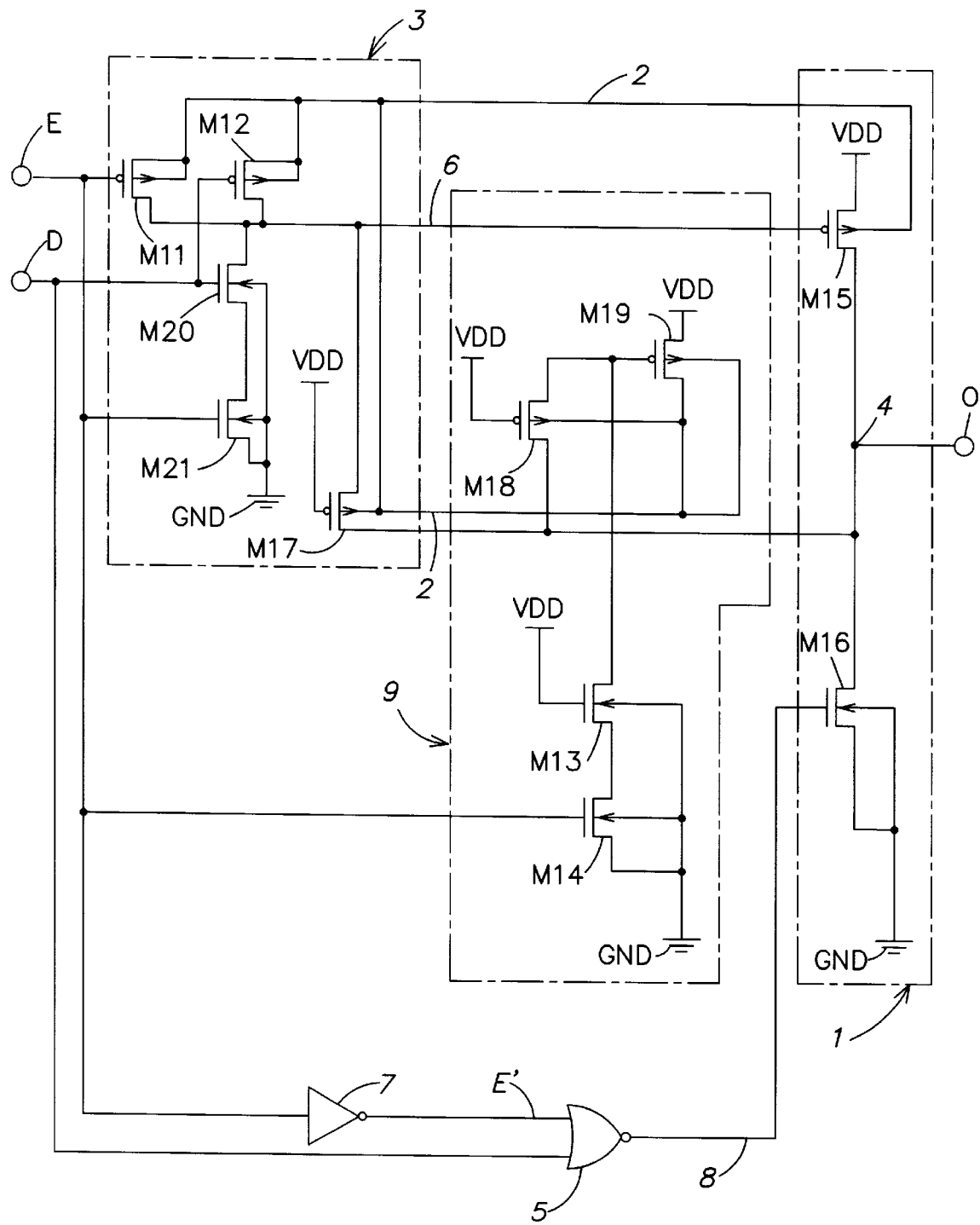
FIG. 2 is a circuit diagram of a second embodiment of CMOS output buffer circuit according to the invention, with three-state capability.

In FIG. 2 another embodiment of the invention is shown. This second embodiment relates to a CMOS buffer circuit having three-state capability.

The buffer circuit further comprises a control circuitry for the activation of the final stage. The control circuitry comprises, in a per-se known way, a two-input NAND gate 3, with a first input connected to an enable/disable signal E, a second input connected to an input data signal D and an output 6 connected to the gate of the pull-up M15, and a NOR gate 5 with a first input connected to a logical complement E' of the enable/disable signal E (logical complement that is provided by an inverter 7), a second input connected to the input data signal D and an output 8 connected to the gate of the pull-down M16.

In FIG. 2, the detailed circuit structure of the two-input NAND gate 3 is shown; conventionally, the NAND gate 3 comprises two parallel-connected P-channel transistors M11, M12 in series with two serial-connected N-channel transistors M20, M21. However, the common source node of M11 and M12 is not connected to the voltage supply VDD, as in conventional buffer circuits, being instead connected to the switchable bulk line 2 to which the bulk of the pull-up M15 is also connected. Furthermore, the NAND gate 3 comprises a P-channel MOSFET M17 with gate connected to VDD, drain connected to the output 6 of the NAND gate, and source connected to the output node 4 of the final stage; the bulk electrode of M17 is connected to the circuit node 2.

According to the invention, the control circuitry comprises an auxiliary circuit 9. The auxiliary circuit 9 comprises a P-channel MOSFET M19 with source connected to VDD, drain and bulk connected to the circuit node 2 and gate connected to the drain of an N-channel MOSFET M13; this last has the gate connected to VDD and the source connected to the drain of another N-channel MOSFET M14 with source connected to ground and gate connected to the enable/disable signal E; the bulk of both M13 and M14 is connected to ground. A further P-channel MOSFET M18 with gate connected to VDD has the drain connected to the gate of M19, the source connected to the output node 4 and the bulk connected to the circuit node 2. The N-channel MOSFETs M13 and M14 forms a bias network for the P-channel MOSFET M19.

The operation of the three-state CMOS buffer of the present invention will be now given. Firstly, it is assumed that the output buffer circuit is enabled (i.e. not in the three-state mode): the enable/disable signal E is high ("1"), and its complemented signal E' is low ("0"). In this condition, M14 is on, the source of M13 is tied to ground, and M13 is on; the gate of M19 is thus tied to ground, and M19 is on: circuit node 2 is thus connected, through M19, to VDD.

The output 6 of the NAND 3 and the output 8 of the NOR gate 5 are high or low depending on the logic state of the input data signal D. More precisely, if D="0" the output 8 is "1" and the output 6 is "1" the pull-up M15 is off and the pull-down M16 is on, and the output signal O is tied to ground (i.e. it is a logic "0"). If D="1" the output 8 is "0" and the output 6 is "0": the pull-down M16 is off and the pull-up M15 is on, and the output 0 is tied to VDD (i.e. it is a logic "1").

The P-channel MOSFET M17 is off, since neither its source voltage nor its drain voltage can exceed its gate voltage (VDD) plus its threshold voltage Vth (in absolute value).

Also the P-channel MOSFET M18 is off, for the same reasons as M17.

Let's now assume that the output buffer circuit is disabled (i.e. in the three-state mode): E="0", E="1", node 6 is tied to node 2 by M11 and M15 is off, also, the output 8 is low and M16 is off: both the pull-up M15 and the pull-down M16 of the final stage are off, thus node 4 is in a high-impedance condition.

M14 is off, so that the gate of M19 is left floating; however, the bulk of M19 is always at VDD: in fact, if M19, prior to entering the three-state mode, was in saturation, it remains in this condition because its gate capacitance does not have a discharge path; otherwise, the bulk of M19 will be biased at VDD by the parasitic source-bulk junction diodes of M19 and M15.

It is to be noted that, even if the gate of M19 is left floating, there is no static dissipation, because M19 has a purely capacitive load given by the bulk and, through M11, the input capacitance of M15.

If however another output buffer circuit supplied with a voltage higher than VDD (for example 5 V) and connected to the same output data signal line 0 to which the output node 4 is connected causes the voltage of O to exceed VDD+Vth, M17 turns on and transfers the voltage of O onto the output 6 of the NAND gate 3, which causes the pull-up M15 to turn off. Also, M18 turns on, so that the gate voltage of M19 raises toward the voltage of node 0 and M19 turns off; MOSFETs M11 and M12 transfer the voltage of node 6 to the switchable bulk line 2. In this way, the voltage of the bulk of M15 is made to coincide to the voltage of node O (higher than VDD). This prevents the drain-bulk junction of MOSFET M15 from being forward biased, and no leakage current flow.

It appears that the auxiliary circuit 9 substantially behaves as a diode between VDD and the switchable bulk line 2, biasing the bulk line 2 to VDD when the output is not higher than VDD, while NAND circuit 3 behaves as a diode between the node 0 and the switchable bulk line 2, biasing it to the voltage of the output when this exceeds VDD.

It is also to be noted that the bias network comprised of the N-channel MOSFETs M14 and M13 could be more simply implemented by a single N-channel MOSFET, driven by the signal E. However, by providing the further N-channel MOSFET M13, it is assured that no conductive paths are formed from the output node 4 to ground when the supply voltage VDD drops (power-down) while the signal E is high.

It appears that the CMOS buffer circuit of FIG. 2 becomes functionally similar to that of FIG. 1 when it is not in three-state mode, in this operating condition, signal E-"1", M11 is off (open-circuit), M21 and M14 are on (short-circuit). Signal 8 is equal to the logic complement of signal D.

The three-state CMOS output buffer circuit is rather simple, the number of transistors required being quite small. Furthermore, the circuit does not require external power supplies, and can be fabricated with low-cost HCMOS technologies.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A CMOS output buffer circuit comprising:
    a final amplifier stage including a pull-up transistor and a pull-down transistor connected between a voltage supply and ground and having a common output node, the pull-up transistor having a bulk electrode connected to a switchable bulk line;
    a control circuitry for driving the final amplifier stage including:
        a first logic gate supplied with an input data signal, the first logic gate driving the pull-up transistor; and a second logic gate supplied with said input data signal, the second logic gate driving the pull-down transistor,
        wherein a voltage supply terminal of the first logic gate is connected to said switchable bulk line;
    an auxiliary circuit to selectively couple said switchable bulk line to the voltage supply as long as a voltage of the output node is not higher than said voltage supply and to selectively decouple the switchable bulk line from the voltage supply when the voltage of the output node exceeds the supply voltage; and the first logic gate including means for transferring the voltage on the output node to said voltage supply terminal, and thus to said switchable bulk line, when the voltage of the output node exceeds the supply voltage, wherein said auxiliary circuit includes switching means which as long as the voltage of the output node is not higher than the supply voltage are activated to connect said switchable bulk line to the supply voltage, and driving means which when the voltage of the output node exceeds the supply voltage deactivates said switching means, and wherein said switching means comprises a first transistor connected between the voltage supply and the switchable bulk line and having a bulk electrode connected to the switchable bulk line, and said driving means comprises a second transistor connected between the output node and a control electrode of the first transistor, and having a control electrode and a bulk electrode respectively connected to the voltage supply and to the switchable bulk line.

2. A CMOS output buffer circuit comprising:

a final amplifier stage comprising a pull-up transistor and a pull-down transistor connected between a voltage supply and ground and having a common output node, the pull-up transistor having a bulk electrode connected to a switchable bulk line;

a control circuitry for driving the final amplifier stage comprising:
  a first logic gate supplied with an input data signal, the first logic gate driving the pull-up transistor; and
  a second logic gate supplied with said input data signal, the second logic gate driving the pull-down transistor,
  wherein a voltage supply terminal of the first logic gate is connected to said switchable bulk line;

an auxiliary circuit to selectively couple said switchable bulk line to the voltage supply as long as a voltage of the output node is not higher than said voltage supply and to decouple the switchable bulk line from the voltage supply when the voltage of the output node exceeds the supply voltage, said auxiliary circuit including switching means which, as long as the voltage of the output node is not higher than the supply voltage, are activated to connect said switchable bulk line to the supply voltage, and driving means which when the voltage of the output node exceeds the supply voltage deactivate said switching means, said switching means including a first transistor connected between the voltage supply and the switchable bulk line and having a bulk electrode connected to the switchable bulk line, said driving means including a second transistor connected between the output node and a control electrode of the first transistor, and having a control electrode and a bulk electrode respectively connected to the voltage supply and to the switchable bulk line, the auxiliary circuit further including biasing means for biasing the first transistor in an on condition when the supply voltage is higher than a predetermined voltage, and wherein the first logic gate includes means for transferring the voltage of the output node to said voltage supply terminal, and thus to said switchable bulk line, when the voltage of the output node exceeds the supply voltage.

3. The CMOS output buffer circuit according to claim 2, wherein in said biasing means comprises a third transistor connected between the control electrode of the first transistor and the ground, and having a control electrode connected to the voltage supply.

4. A CMOS output buffer circuit comprising:

a final amplifier stage comprising a pull-up transistor and a pull-down transistor connected between a voltage supply and ground and having a common output node, the pull-up transistor having a bulk electrode connected to a switchable bulk line;

a control circuitry for driving the final amplifier stage comprising:
  a first logic gate supplied with an input data signal, the first logic gate driving the pull-up transistor; and
  a second logic gate supplied with said input data signal, the second logic gate driving the pull-down transistor,
  wherein a voltage supply terminal of the first logic gate is connected to said switchable bulk line;

an auxiliary circuit to selectively couple said switchable bulk line to the voltage supply as long as a voltage of the output node is not higher than said voltage supply and to selectively decouple the switchable bulk line from the voltage supply when the voltage of the output node exceeds the supply voltage, said auxiliary circuit including switching means which, as long as the voltage of the output node is not higher than the supply voltage, are activated to connect said switchable bulk line to the supply voltage, and driving means which when the voltage of the output node exceeds the supply voltage deactivate said switching means, said switching means including a first transistor connected between the voltage supply and the switchable bulk line and having a bulk electrode connected to the switchable bulk line, said driving means including a second transistor connected between the output node and a control electrode of the first transistor, and having a control electrode and a bulk electrode respectively connected to the voltage supply and to the switchable bulk line; and the first logic gate including means for transferring the voltage of the output node to said voltage supply terminal, and thus to said switchable bulk line, when the voltage of the output node exceeds the supply voltage;

wherein said first logic gate is a CMOS inverter and said means for transferring the voltage of the output node to the switchable bulk line includes a fourth transistor connected between said switchable bulk line and an output of the inverter which is connected to a control electrode of the pull-up transistor, said fourth transistor being respectively controlled by the input data signal, and said second transistor connected between the output node and said output of the inverter and having a gate electrode and a bulk electrode respectively connected to the voltage supply and the switchable bulk line.

5. A CMOS output buffer circuit comprising:

a final amplifier stage that includes a pull-up transistor and a pull-down transistor connected between a voltage supply terminal having a supply voltage and a ground terminal and sharing a common output node, the pull-up transistor having a bulk electrode connected to a switchable bulk line;

an auxiliary circuit to selectively couple the switchable bulk line to the voltage supply terminal as long as a voltage of the output node is not higher than the supply voltage, and to selectively decouple the switchable bulk line from the voltage supply terminal when the voltage of the output node exceeds the supply voltage;

a first logic gate to drive the pull-down transistor, a control terminal of the first logic gate to receive the input data signal; and a second logic gate to drive the pull-up transistor, the second logic gate including a first transistor having:
  a control terminal to receive the input data signal;
  a first terminal connected to the switchable bulk line; and
  a second terminal to control the pull-up transistor,
  wherein the second terminal of the first transistor is coupled to the output node of the final amplifier stage, and wherein the second logic gate is operative to transfer the voltage on the output node of the final amplifier stage to the switchable bulk line when the voltage of the output node exceeds the supply voltage.

6. The CMOS buffer circuit of claim 5, wherein the second terminal of the first transistor is connected to a control electrode of the pull-up transistor.

7. The CMOS buffer circuit of claim 5, wherein the second logic gate further comprises:
  a second transistor having a third terminal connected to the output node of the final amplifier stage, a fourth terminal connected to the second terminal of the first transistor, a control terminal connected to the voltage supply terminal, and a bulk electrode connected to the switchable bulk line.

8. The CMOS buffer circuit of claim 7, therein the second terminal of the first transistor and the fourth terminal of the second transistor are connected to a control electrode of the pull-up transistor.

9. The CMOS output buffer circuit of claim 5, wherein the auxiliary circuit includes a switching circuit to connect the switchable bulk line to the supply voltage as long as the voltage of the output node is not higher than the supply voltage.

10. The CMOS output buffer circuit of claim 9 wherein the switching circuit includes a third transistor connected between the voltage supply terminal and the switchable bulk line and having a bulk electrode connected to the switchable bulk line.

11. The CMOS buffer circuit of claim 10, wherein the auxiliary circuit further includes a biasing circuit to bias the third transistor in an on condition when the supply voltage is higher than a predetermined voltage.

12. The CMOS output buffer circuit of claim 11, wherein in the biasing circuit includes a fifth transistor connected between a control electrode of the third transistor and the ground terminal, the fifth transistor having a control electrode connected to the voltage supply terminal.

13. The CMOS output buffer circuit of claim 9, wherein the auxiliary circuit further includes a driving circuit to deactivate the switching circuit when the voltage of the output node exceeds the supply voltage.

14. The CMOS output buffer circuit of claim 13, wherein the driving circuit includes a fourth transistor connected between the output node and a control electrode of the first transistor, the fourth transistor having a control electrode connected to the voltage supply terminal and a bulk electrode connected to the switchable bulk line.

15. The CMOS output buffer circuit of claim 5, wherein the second logic gate includes a third transistor having a control terminal to receive the input signal, a first terminal connected to the ground terminal, and a second terminal connected to the second terminal of the first transistor,
  wherein the first transistor and the third transistor form a first inverter.

16. The CMOS output buffer circuit of claim 5, wherein the first and second logic gates each receive an enable/disable signal for activating a three-state mode in which the pull-up transistor and the pull-down transistor are both deactivated.

* * * * *